United States Patent
Quesnel

(10) Patent No.: US 7,012,753 B2
(45) Date of Patent: Mar. 14, 2006

(54) OPTICAL DEVICE WITH ENHANCED MECHANICAL STABILITY OPERATING IN THE EXTREME ULTRAVIOLET AND LITHOGRAPHY MASK COMPRISING SUCH A DEVICE

(75) Inventor: Etienne Quesnel, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/803,059

(22) Filed: Mar. 18, 2004

(65) Prior Publication Data
US 2004/0233535 A1 Nov. 25, 2004

(30) Foreign Application Priority Data
Apr. 1, 2003 (FR) .................................. 03 04071

(51) Int. Cl.
*G02B 1/10* (2006.01)
(52) U.S. Cl. .................... 359/584; 359/350; 359/582; 359/586
(58) Field of Classification Search ................ 359/360, 359/359, 580, 585, 586, 589, 582, 584, 350; 430/5; 428/627; 378/84
See application file for complete search history.

(56) References Cited

U.S. PATENT DOCUMENTS

| 4,684,565 A * | 8/1987 | Abeles et al. ............... 428/220 |
| 5,310,603 A | 5/1994 | Fukuda et al. |
| 5,958,605 A * | 9/1999 | Montcalm et al. .......... 428/627 |
| 6,396,900 B1 | 5/2002 | Barbee et al. |
| 6,869,676 B1 * | 3/2005 | Burger et al. ............... 428/336 |
| 2002/0014403 A1 * | 2/2002 | Hoshino ................. 204/192.32 |

OTHER PUBLICATIONS

Amorphous silicon carbide coatings for extreme ultraviolet optics, Applied Optics, vol. 27, No. 14, Kortfight et al ,pp. 2841-2846.*

Drüsedau et al. "The Hydrogenated Amorphous Silicon/ Nanodisperse Metal (Simal) System—Films of Unique Electronic Properties," Journal of Non-Crystalline Solids 198-200 (1996) 829-832.

Kim et al. "Annealing Effects on a-SiC:H and a-SiC:H(F) Thin Films Deposited by PECVD at Room Temperature," Thin Solid Films 261 (1995) 192-201.

* cited by examiner

*Primary Examiner*—Audrey Chang
(74) *Attorney, Agent, or Firm*—Oliff & Berridge, PLC

(57) ABSTRACT

An optical device reflecting a range of wavelengths comprised between 10 nm and 20 nm comprises alternate superposed first and second layers. The first layers are made of metal or metallic compound and the second layers are formed by an amorphous silicon compound chosen from a-Si—$H_x$, a-Si—$CH_x$, a-Si—$C_x$, a-Si—$OH_x$, a-Si—$F_x$, a-Si—$FH_x$, a-Si—$N_x$, a-Si—$NH_x$, x being comprised between 0.01 and 0.3. The use of second layers of amorphous silicon compound enables the mechanical stresses of the optical device to be stabilized up to at least 200° C. The optical device is preferably used as reflector for a lithography mask in the extreme ultraviolet (EUV).

12 Claims, 4 Drawing Sheets

OPTICAL DEVICE WITH ENHANCED MECHANICAL STABILITY OPERATING IN THE EXTREME ULTRAVIOLET AND LITHOGRAPHY MASK COMPRISING SUCH A DEVICE

BACKGROUND OF THE INVENTION

The invention relates to an optical device reflecting a range of wavelengths comprised between 10 nm and 20 nm and comprising alternate superposed first and second layers, said first layers being made of metal or metallic compound and said second layers comprising amorphous silicon.

The invention also relates to a lithography mask comprising such an optical device.

STATE OF THE ART

Optical devices designed to reflect a range of wavelengths comprised in the extreme ultraviolet (EUV), i.e. between 10 nm and 20 nm, are generally composed of several alternate layers of molybdenum and silicon. Thus, the article "The hydrogenated amorphous silicon/nanodisperse metal (SI-MAL) system—Films of unique electronic properties" (T.P. Drüsedau et al, Journal of Non Crystalline Solids 198–200 (1996), pages 829–832) mentions that multilayer systems comprising amorphous silicon or hydrogenated amorphous silicon and metals are used as mirrors in the field of soft X-rays.

Lithography masks 1 used in EUV generally comprise a substrate 2 covered by a reflector 3 composed of several alternate layers (also called multilayer stacking) preferably of amorphous silicon and molybdenum, and a protective layer whereon a silicon buffer layer 4 and an absorbent layer 5 are deposited (FIG. 1).

The Mo/Si couple enables a theoretical maximum reflection of 74% to be obtained for a wavelength of 13.4 nm. It is however difficult to achieve this theoretical maximum value, notably due to an interdiffusion phenomenon taking place between the silicon and molybdenum. Thus, instead of a periodic system of two superposed molybdenum and silicon layers (Mo/Si), a periodic system of 4 layers of Mo/MoSi$_x$/Si/SiMo$_y$ is created in the optical device, MoSi$_x$ and SiMo$_y$ corresponding to a part of the layers of molybdenum and silicon in which silicon and molybdenum respectively diffuse. Such a periodic system has a thermally less stable reflectivity than the theoretical periodic system Mo/Si.

However an optical device such as a lithography mask reflector used in EUV must have low mechanical stresses and stable mechanical and optical properties over time, in particular when the optical device is subjected to thermal or environmental stresses. A lithography mask designed to undergo a series of operations liable to expose the reflector to temperature conditions close to 200° C. must in fact conserve stable mechanical and optical properties throughout its time of use.

Alternatives to the Mo/Si couple have thus been proposed to make the optical properties stable. It is thus possible to use a four-layer periodic system, a layer of molybdenum carbide, boron carbide or carbon being interposed between the layers of molybdenum and silicon so as to respectively obtain the following periodic systems: Mo/Mo$_2$C/Si/Mo$_2$C, Mo/B$_4$C/Si/B$_4$C or Mo/C/Si/C. The periodic system Mo/B$_4$C/Si/B$_4$C is for example illustrated in U.S. Pat. No. 6,396,900. It is also possible to use a two-layer periodic system replacing the molybdenum by molybdenum carbide so as to obtain the periodic system Mo$_2$C/Si.

Thus, T. Feigl et al, in the article "Magnetron sputtered EUV mirrors with high thermal stability" (Emerging Lithographic Technologies IV, Elisabeth A. Dobisz, Editor, Proceedings of SPIE, vol 3997 (2000), pages 420 to 430), indicate that the reflectivity of Mo/Si type multilayer stackings decreases greatly following annealings performed above 300° C. whereas Mo$_2$C/Si type multilayer stackings have a thermally stable reflectivity up to 600° C. Even if these solutions enable the optical properties of the device to be improved and to make them thermally stable, the mechanical properties of such multilayer stackings decrease by several tens of MPa with temperature.

The mechanical stress level of the Mo/Si couple is relatively high. Thus, in a mirror comprising an alternation of 40 first layers of molybdenum and 40 second layers of amorphous silicon, the initial mechanical stresses of the mirror are −400 MPa. FIG. 2 representing the effects of cumulated annealings performed during 16 hours and in a vacuum on such a mirror also indicates that the mechanical stresses vary greatly according to the temperature. However, for a lithography mask used in EUV for example, the maximum deformation allowed is 50 nm, which is not compatible with such a variation of mechanical stresses, the latter greatly conditioning the flatness of the optical wave front of the lithography mask.

It has been proposed, in the document WO99/42414, to use the thermal instability of the mechanical stresses of the Mo/Si couple to reduce the stress level in multilayer systems by performing annealings between 100° C. and 300° C. This method is however not reproducible.

OBJECT OF THE INVENTION

An object of the invention is to achieve an optical device whose mechanical stresses are stable with respect to a temperature variation while at the same time preserving a maximum optical reflection.

According to the invention, this object is achieved by the appended claims.

More particularly, this object is achieved by the fact that the second layers are formed by an amorphous silicon compound chosen from a-Si—H$_x$, a-Si—CH$_x$, a-Si—C$_x$, a-Si—OH$_x$, a-Si—F$_x$, a-Si—FH$_x$, a-Si—N$_x$, a-Si—NH$_x$, x being comprised between 0.01 and 0.3.

According to a preferred embodiment, each first layer is formed by an intermediate metal layer arranged between two peripheral layers.

According to another feature of the invention, the metal is molybdenum.

Another object of the invention is to achieve a lithography mask with stable mechanical stresses over time.

According to the invention, this object is achieved by the fact that the lithography mask comprises an optical device as described above.

According to a development of the invention, the thickness of an assembly formed by superposed first and second layers is 6.9 nm.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF A PARTICULAR EMBODIMENTS

Figure 6:
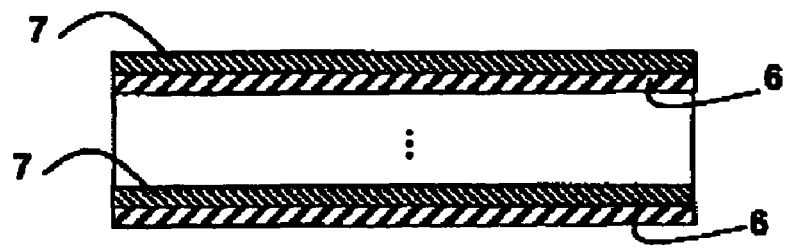
FIG. 6 is a schematic representation of a multilayer structure with alternate superposed first and second layers.

An optical device reflecting a range of wavelengths comprised between 10 nm and 20 nm comprises alternate superposed first and second layers 6 and 7 (FIG. 6). The first layers 6 are made of metal and preferably molybdenum or of metallic compound and preferably molybdenum carbide. The second layers 7 are formed by an amorphous silicon compound chosen from a-Si—$H_x$, a-Si—$CH_x$, a-Si—$C_x$, a-Si—$OH_x$, a-Si—$F_x$, a-Si—$FH_x$, a-Si—$N_x$, and a-Si—$NH_x$, x being comprised between 0.01 and 0.3. Thus a radical chosen from —H, —CH, —C, —OH, —F, —FH, —N and —NH is incorporated in the amorphous silicon so as to saturate the dangling bonds in the amorphous silicon. For example, what is meant by a-Si—$H_x$ compound is a compound formed by hydrogenated amorphous silicon, i.e., amorphous silicon in which a predetermined hydrogen content is incorporated. The hydrogen content to be incorporated is situated in the range 1 to 25% of bonded atomic hydrogen.

Figure 2:
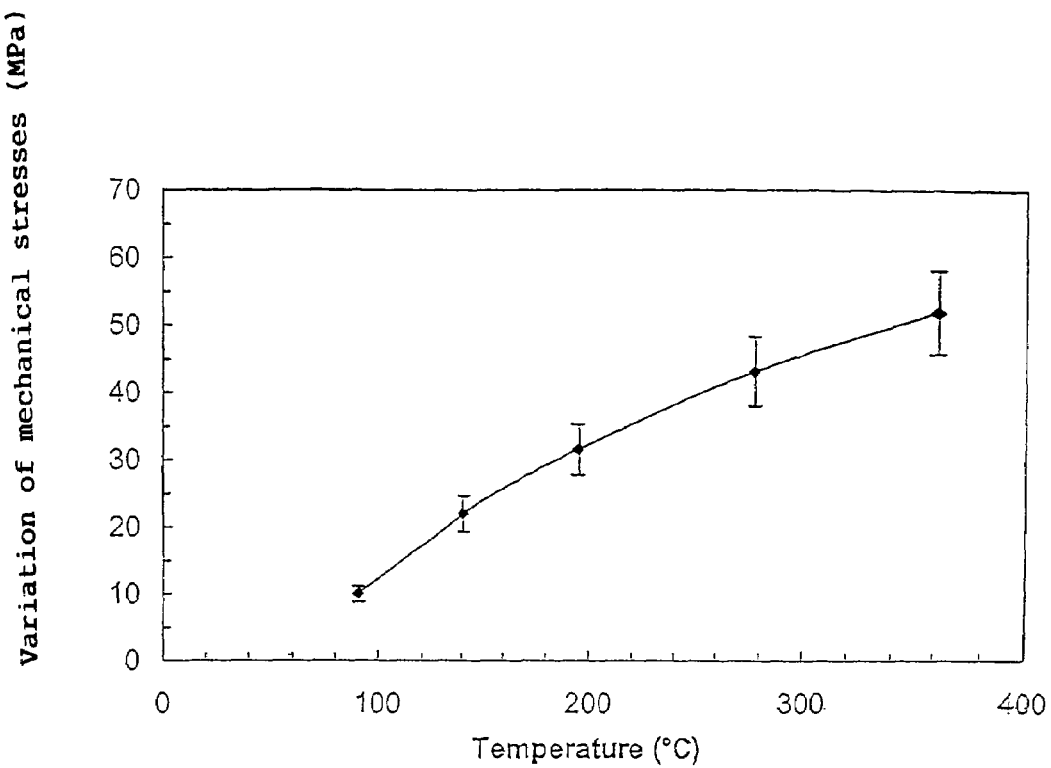
FIG. 2 is a graph representing a variation of the mechanical stresses versus temperature for a reflector according to the prior art.

The use of the second amorphous silicon compound layers enables the mechanical stresses of the optical device to be thermally stabilized. It is in fact known that the mechanical stresses of a multilayer stacking of molybdenum and amorphous silicon (Mo/a-Si) are considerably modified when the stacking undergoes annealing for several hours (FIG. 2). This modification depends in particular on the environment. Thus, for annealings of two hours performed in a nitrogen atmosphere, the variation of the mechanical stresses is about a few hundred MPa whereas the variation of the mechanical stresses is about a few tens of MPa for annealings of two hours performed in a vacuum. A variation of the mechanical stresses of a few tens of MPa still however remains too high for optical applications such as lithography masks.

Figure 3:
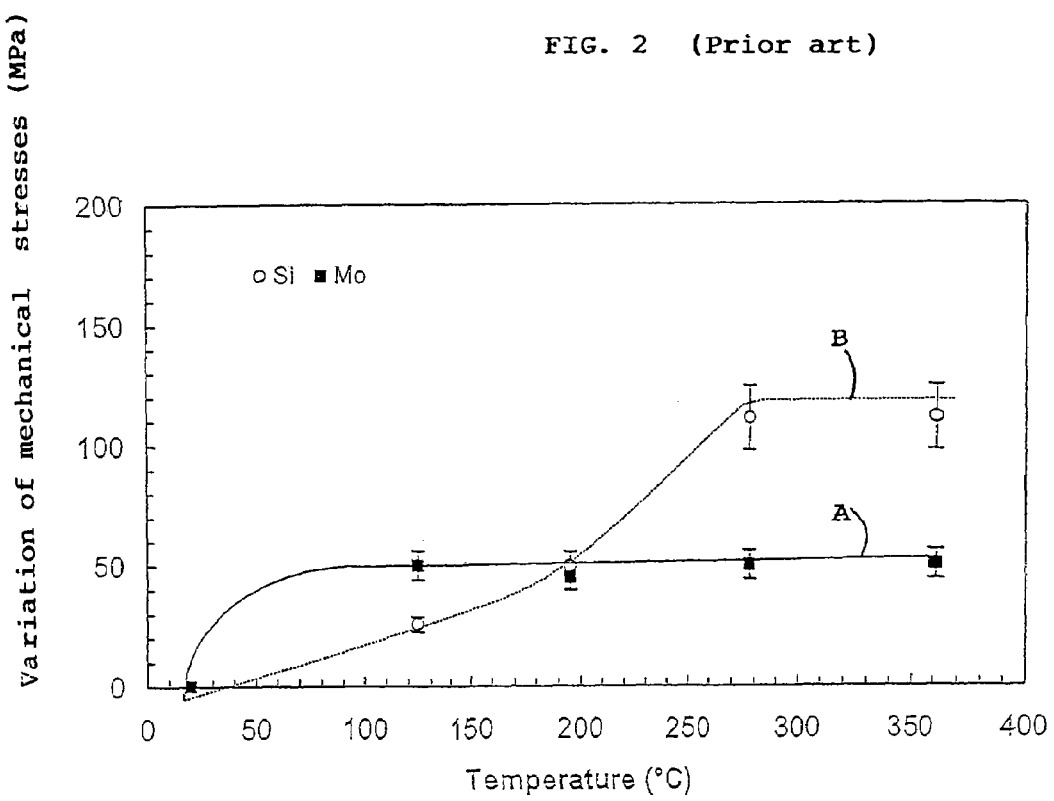
FIG. 3 is a graph representing a variation of the mechanical stresses versus temperature for a molybdenum layer and for a silicon layer.

When a layer of molybdenum of a thickness of 100 nm and a layer of amorphous silicon of a thickness of 100 nm respectively undergo annealings performed in a vacuum for 16 hours (FIG. 3), the behaviour of the mechanical stresses versus temperature differs greatly in the molybdenum layer (curve A) and in the amorphous silicon layer (Curve B). Thus, the mechanical stresses of the Mo layer, initially −2500 MPa, increase up to 80° C. then stabilize, whereas the mechanical stresses of the a-Si layer increase greatly with temperature. Thus, the variation rate of the mechanical stresses is about 2% for the Mo layer and about 10% for the a-Si layer. The modification of the mechanical stresses in the Mo- and Si—base multilayer stackings is probably due to the instability of silicon.

Thus, according to the invention, saturation of the dangling bonds in the amorphous silicon by the radicals —H, —CH, —C, —OH, —F, —FH, —N, —NH enables relaxation of the mechanical stresses due to creep of the silicon matrix to be prevented. An a-Si—$H_x$ layer in fact presents initial mechanical stresses very close to that of an amorphous silicon layer, i.e. close to −950 MPa. The mechanical ageing behaviour of a hydrogenated silicon layer is on the other hand different from that of an amorphous silicon layer.

Figure 4:
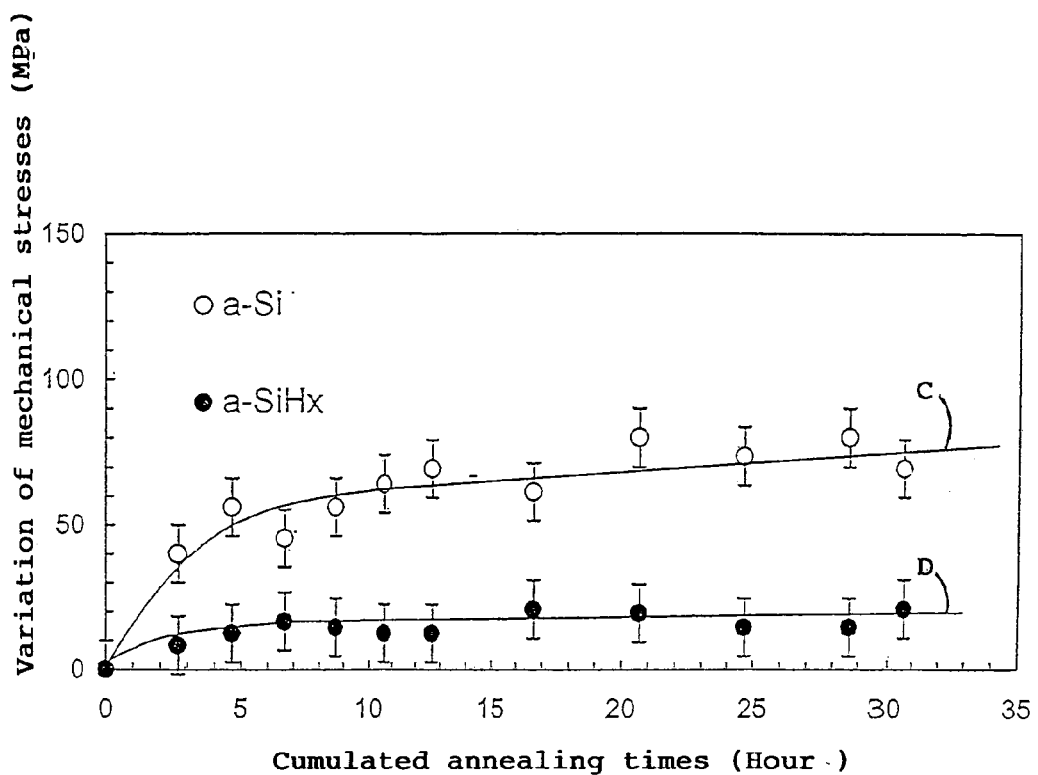
FIG. 4 is a graph representing a variation of the mechanical stresses versus annealing times for an a-Si layer and for an a-Si—$H_x$ layer.

Thus, FIG. 4 illustrates the difference of behaviour of the mechanical stresses for an a-Si layer (Curve C) and for an a-Si—$H_x$ layer (Curve D) when they respectively undergo cumulated annealings at 195° C. Each layer has a thickness of 100 nm and the a-Si—$H_x$ layer is achieved by Ion Beam Sputtering (IBS) deposition by sputtering a silicon target with a sputtering gas composed of argon and 5% hydrogen volume. The hydrogenated silicon deposition can also be performed by sputtering the silicon target in a reactive hydrogen atmosphere. For the amorphous silicon layer, the annealings give rise to a large variation of the mechanical stresses during the first hours of annealing (up to 7 hours) but also a progressive variation throughout the duration of the cumulated annealings. For the hydrogenated amorphous silicon layer on the other hand, the annealings give rise to a small variation of the mechanical stresses up to 5 hours of annealing, then the mechanical stresses stabilize. Thus, the relative variation of the mechanical stresses in the amorphous silicon layer is about 5% to 6%, whereas this variation is about 1% for the a-Si—$H_x$ layer. Incorporating a predetermined proportion of hydrogen or of a radical chosen from —CH, —C, —OH, —F, —FH, —N, —NH, in the amorphous silicon enables it to be made insensitive to annealings.

Figure 5:
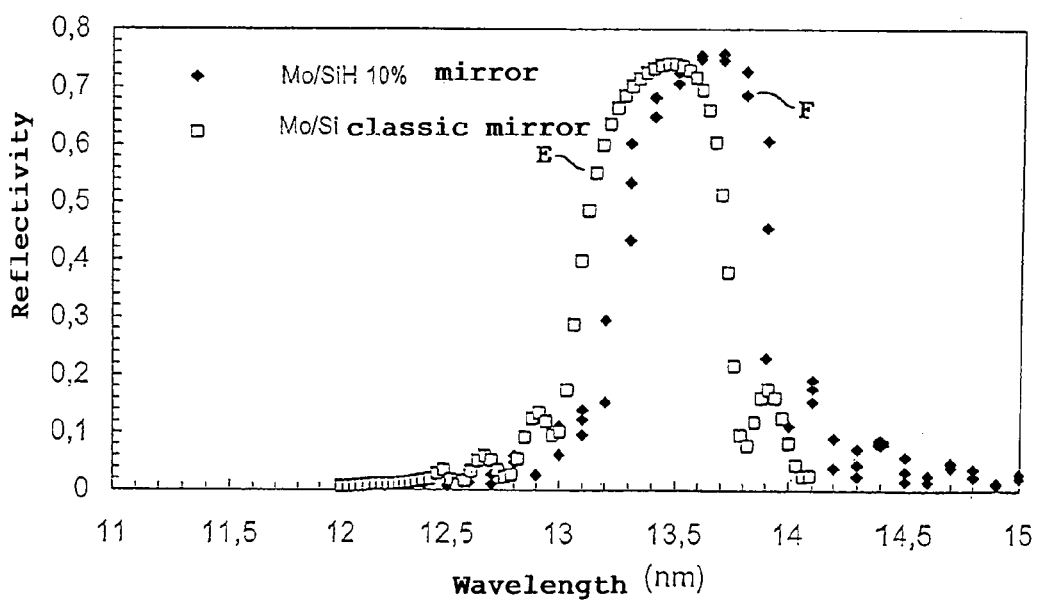
FIG. 5 is a graph representing a variation of the optical responses of two mirrors, respectively according to the prior art and according to the invention, versus the wavelength.

The use of an amorphous silicon compound therefore makes it possible not only to stabilize the mechanical stresses in an optical device comprising a stacking of layers up to at least 200° C., but also to preserve good optical properties. Thus, FIG. 5 represents a theoretical simulation of the optical responses of two mirrors each comprising a multilayer stacking. The curve E corresponds to a stacking of 40 layers of molybdenum alternated with 40 layers of amorphous silicon, whereas curve F corresponds to a stacking of 40 layers of molybdenum alternated with 40 layers of hydrogenated amorphous silicon a-Si—$H_{0.1}$. The thickness of molybdenum and hydrogenated amorphous silicon layers are respectively 4.1 nm and 2.8 nm. The mirror comprising the Mo/a-Si—$H_{0.1}$ stacking presents a reflectivity equivalent to that of a mirror comprising a Mo/Si stacking. Thus, the addition of hydrogen does not adversely affect the optical properties of the mirror. The molybdenum layers of the mirror according to curve F were achieved by sputtering a molybdenum target with argon or xenon whereas the a-Si—$H_{0.1}$ layers were achieved by sputtering silicon in a hydrogen reactive atmosphere.

According to the invention, the first layers of the optical device can also be formed by a metallic compound such as a molybdenum carbide $Mo_2C$ or a metal nitride. This presents the advantage, for a mirror comprising an alternate stacking of 40 layers of $Mo_2C$ and 40 layers of a-Si—$H_x$ of keeping stable mechanical stresses over a higher temperature range, and preferably up to 350° C.

Figure 7:
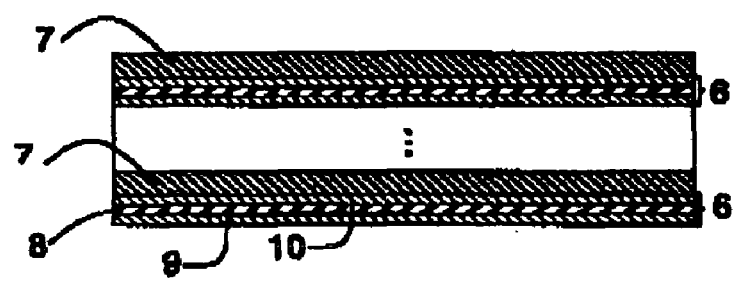
FIG. 7 is a schematic representation of a multilayer structure with alternate superposed first and second layers, the first layer being formed by an intermediate metal layer arranged between first and second peripheral layers so as to form a superposition of three layers.

Each first layer 6 of the optical device can also be formed by an intermediate metal layer 8 arranged between two peripheral layers 9 and 10 (FIG. 7). The peripheral layers 9 and 10 can be made of carbide of said metal, and preferably of molybdenum carbide. The peripheral layers 9 and 10 can also be made of boron carbide, carbon, or nitride of said metal. Thus, according to the invention, a stacking formed by an alternation of first and second layers 6 and 7 can be of the type MY/M/MY/a-Si—$H_x$, $B_4C$/M/$B_4C$/a-Si—$H_x$ or C/M/C/a-Si—$H_x$, M being a metal, MY being a metallic compound such as a carbide or a nitride of said metal and C being carbon. Thus, as an example, the layer of $Mo_2C$ is replaced by three superposed layers, respectively of $Mo_2C$, Mo, and $Mo_2C$, the whole having a total thickness of 2.8 nm. This presents the advantage of improving the optical reflectivity compared with a $Mo_2C$/a-Si—$H_x$, stacking, while keeping a mechanical stability over a temperature range of up to 350 C. A similar result is obtained when the $Mo_2C$ layer is replaced by three superposed layers respectively of $B_4C$, Mo and $B_4C$.

The first and second layers of the stacking can be achieved by any known type of process for achieving thin films. Thus, they can be achieved by Physical Vapour Deposition (PVD) or by Chemical Vapour Deposition (CVD).

Figure 1:
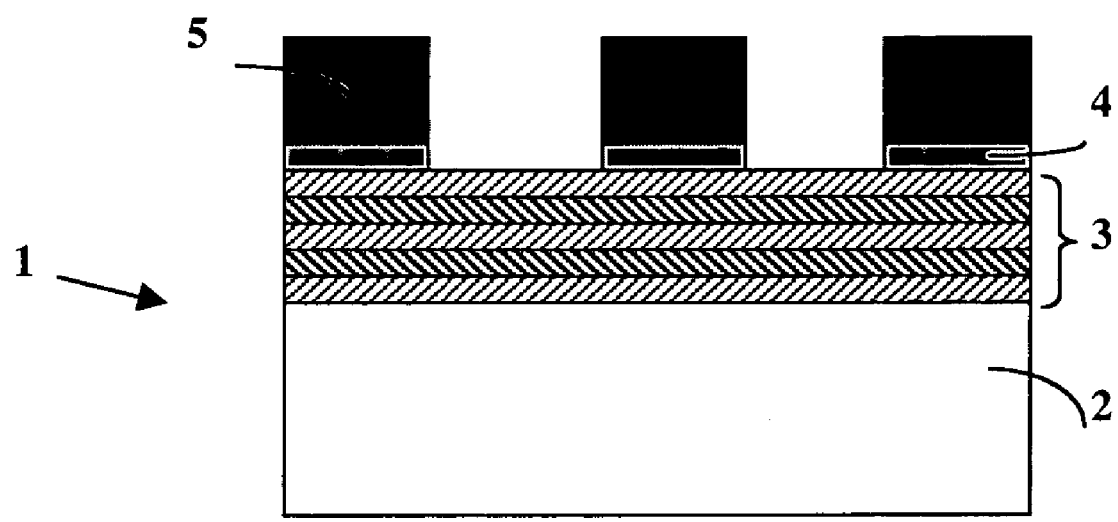
FIG. 1 is a schematic representation of a lithography mask according to the prior art.

An optical device according to the use makes it possible in particular to achieve a reflector for a lithography mask used in EUV, such as that represented in FIG. 1. The multilayer reflector is preferably composed of an alternation of 40 to 60 first layers of molybdenum or molybdenum carbide and 40 to 60 second layers formed by an amorphous silicon compound chosen from a-Si—$H_x$, a-Si—$CH_x$, a-Si—$C_x$, a-Si—$OH_x$, a-Si—$F_x$, a-Si—$FH_x$, a-Si—$N_x$, a-Si—$NH_x$, x being comprised between 0,01 and 0,3. The thickness of an assembly formed by a superposed first and second layer defines the period of the stacking and the centering wavelength of the reflector for which reflectivity is maximum. It is preferably 6.9 nm for an angle of incidence close to the normal and when the reflector operates at a wavelength of 13.4 nm. Such a lithography mask presents the advantage of having not only good optical properties but also stabilized mechanical stresses up to at least 200° C. This makes it possible to achieve lithography masks whose deformation is controlled during their use. The optical device according to the invention can also be used to perform optical functions of mirror, anti-glare or filtering type.

What is claimed is:

1. Optical device reflecting a range of wavelengths comprised between 10 nm and 20 nm and comprising alternate superposed first and second layers, said first layers being made of metal or metallic compound and said second layers being formed by an amorphous silicon chosen from a-Si—$H_x$, a-Si—$CH_x$, a-Si—$C_x$, a-SiOH$_x$, a-Si—$F_x$, a-Si—$FH_x$, a-Si—$N_x$, a-Si—$NH_x$, x being comprised between 0.01 and 0.3.

2. Optical device according to claim 1, wherein each first layer is formed by an intermediate metal layer arranged between two peripheral layers so as to form a superposition of a first peripheral layer, the intermediate metal layer, and a second peripheral layer.

3. Lithography mask comprising an optical device according to claim 2.

4. Optical device according to claim 1, wherein the two peripheral layers are made of carbide of said metal, nitride of said metal, boron carbide or carbon.

5. Lithography mask comprising an optical device according to claim 4.

6. Optical device according to claim 1, wherein the metal is molybdenum.

7. Lithography mask comprising an optical device according to claim 6.

8. Optical device according to claim 1, wherein the metallic compound is a molybdenum carbide.

9. Lithography mask comprising an optical device according to claim 8.

10. Lithography mask comprising an optical device according to claim 1.

11. Lithography mask according to claim 10, wherein the thickness of the assembly formed by superposed first and second layers is 6.9 nm.

12. Lithography mask according to claim 10, wherein the number of first layers is comprised between 40 and 60.

* * * * *